US005646480A

United States Patent [19]
Carroll et al.

[11] Patent Number: 5,646,480
[45] Date of Patent: Jul. 8, 1997

[54] METAL ASSIST STRUCTURE FOR AN ELECTROLUMINESCENT DISPLAY

[75] Inventors: Roger Carroll, Willimantic; Timothy Eschrich, Manchester; William Tanski, Glastonbury, all of Conn.

[73] Assignee: Northrop Grumman Corporation, Los Angeles, Calif.

[21] Appl. No.: 491,652

[22] Filed: Jun. 19, 1995

[51] Int. Cl.⁶ .................................................. H05B 33/26
[52] U.S. Cl. ........................... 313/503; 313/505; 313/506; 313/353
[58] Field of Search ................................. 313/503, 505, 313/506, 353, 354, 355; 445/35, 49, 55

[56] References Cited

U.S. PATENT DOCUMENTS

| 4,634,934 | 1/1987 | Tohda et al. | 313/503 |
| 4,963,788 | 10/1990 | King et al. | 313/503 |
| 5,399,936 | 3/1995 | Naimki et al. | 313/505 |

FOREIGN PATENT DOCUMENTS 9326139  12/1993  WIPO .

OTHER PUBLICATIONS

O.J. Gregory et al., "Fabrication of High Conductivity Transport Electrodes with Trenched Metal Bus Lines," *Journal of the Electro Chemical Society*, vol. 138, No. 7, Jul. 1991.

*Primary Examiner*—Nimeshkumar Patel
*Attorney, Agent, or Firm*—Walter G. Sutcliff

[57] ABSTRACT

An improved electroluminescent display panel has a plurality of parallel metal assist structures deposited on a glass substrate, a plurality of parallel transparent electrodes are deposited over and aligned with the metal assist structures such that each metal assist structure is surrounded by a transparent electrode. A conventional stack of dielectric and phosphor layers and a plurality of metal electrodes is deposited thereon to complete the electroluminescent display panel.

6 Claims, 2 Drawing Sheets

METAL ASSIST STRUCTURE FOR AN ELECTROLUMINESCENT DISPLAY

TECHNICAL FIELDS

This invention relates to electroluminescent display panels and more particularly to an electroluminescent display panel having a metal assist structure.

BACKGROUND OF THE PRIOR ART

Thin film electroluminescent (TFEL) display panels offer several advantages over other display technologies such as cathode ray tubes (CRT) and liquid crystal displays (LCD). Compared with cathode ray tubes, TFEL display panels require less power, provide a larger viewing angle, and are much thinner. Compared with liquid crystal displays, TFEL display panels have a larger viewing angle, do not require auxiliary lighting and can have a larger display area.

Prior art TFEL display panels such as the panel shown in FIGS. 1 and 2 are generally built on a glass substrate 1. A plurality of parallel transparent electrodes 2 are deposited on the glass. A first layer of dielectric 4, a phosphor layer 6 and a second dielectric layer 8 are deposited over the transparent electrodes 2. A plurality of metal electrodes 5 are applied on top of the second dielectric layer perpendicular to the transparent electrodes 2. The transparent electrodes 2 are typically indium-tin oxide (ITO) and the metal electrodes 5 are typically aluminum. The dielectric layers 4 and 8 protect the phosphor layer 6 from excessive dc currents. When an electrical potential, such as about 200 volts, is applied between the transparent electrodes 2 and the metal electrodes 5, electrons tunnel from one of the interfaces between the dielectric layers 4 and 8 and the phosphor layer 6 into the phosphor layer where they are rapidly accelerated. The phosphor layer 6 typically comprises ZnS doped with Mn. Electrons entering the phosphor layer 6 excite the Mn causing the Mn to emit photons. The photons pass through the first dielectric layer 4, the transparent electrodes 2, and the glass panel 1 to form a visible image.

Speed and brightness uniformity of the electroluminescent display depend critically on the ITO line resistance, particularly for large area displays. Even with integrated ITO lines, a zebra pattern brightness contrast occurs as a result of high resistance. Therefore, to achieve higher conductivity of the transparent electrodes in the electroluminescent display panel, an improved structure was developed in which the low conductivity ITO electrodes were augmented by buses of thick, narrow, high conductivity metals. This improved electroluminescent display is discussed by O. J. Gregory et al. in their article *Fabrication of High Conductivity, Transparent Electrodes with Trenched Metal Bus Lines*, Journal Electro-Chemical Society, Vol. 138, No. 7, July, 1991. In the most common augmented ITO panel an assist structure is on top of each ITO electrode and adjacent the overlaying dielectric layer. In this structure there is a electromagnetic field radiating from the metal into the dielectric. As a result of these fields we have observed that the large electroluminescent panels were failing at the edges. In their article Gregory et al. disclose an augmented ITO electrode in which the metal conductor is recessed into the glass substrate. This structure does not have the deleterious electrical field problem of the prior augmented electroluminescent display panels. However, to make the panel disclosed by Gregory et al. one must etch parallel paths into the glass substrate corresponding to the desired positions of the metal assists. Then the metal must be deposited into the grooves which have been etched into the glass. Etching the glass adds an additional step to the production. Additionally, making such grooves weakens the glass which can cause the glass to crack or fail along those cut paths. Therefore, it is preferable to place a metal assist on top of the glass or a transparent electrode deposited thereon.

We have observed the electric field between a metal assist placed on a transparent electrode and the adjacent dielectric layer. We saw that the strength of that electric field is related to the sharpness of the corner on the metal assist structure. We, therefore, conceived that the problem of high electric fields at the edge of the metal assist structure could be minimized by rounding the corners of each metal assist structure. However, a metal assist structure with rounded corners would be difficult and expensive to fabricate. Accordingly, this is not a practical solution.

Thus, there is a an improved electroluminescent display panel which utilizes a metal assist structure, but does not suffer from the problems created by high electric fields generated at the edges of the metal assist structure. Moreover, such an improved electroluminescent display must be easy to manufacture, preferably adding no significant cost to the current process for making electroluminescent display panels. Moreover, such an improved panel should be able to be made using conventional manufacturing techniques.

SUMMARY OF THE INVENTION

The present electroluminescent display panel utilizes a standard glass substrate to which is applied a metal assist structure for each ITO electrode. The metal assist structure is deposited on top of the glass. A corresponding ITO electrode is deposited over each metal assist structure. The metal assist structure is then fully enclosed by the glass substrate on which the metal has been deposited and the ITO electrode. A conventional stack of dielectric and phosphor layers is deposited on top of the ITO electrodes each having a metal assist structure and the glass substrate in the conventional manner. Then, electrodes are positioned on top of that stack. This improved electroluminescent display panel can be manufactured with standard etching techniques.

Other objects and advantages of the invention will become apparent from a description of the present preferred embodiment shown in the attached drawings.

DESCRIPTION OF THE PREFERRED EMBODIMENTS

Figure 3:
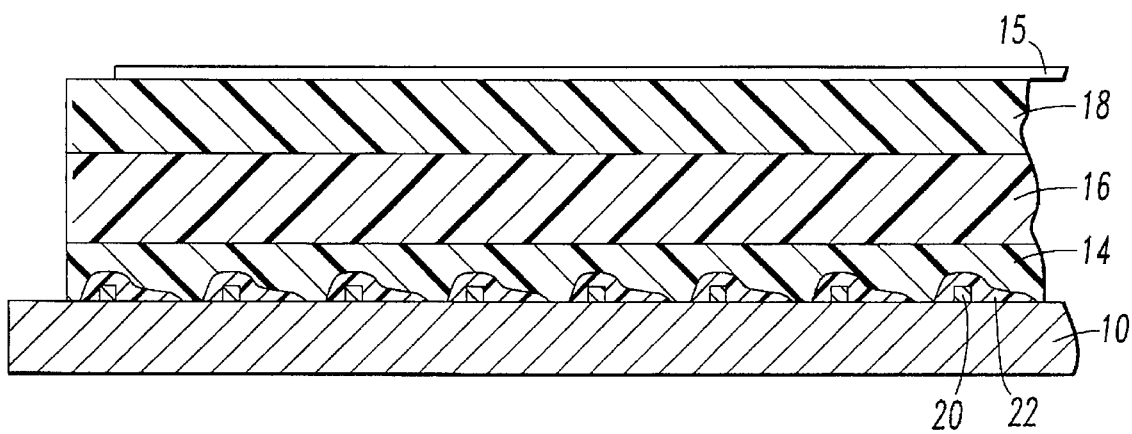
FIG. 3 is a cross sectional view similar to FIG. 2 of a present preferred embodiment of an electroluminescent display having our improved metal assist structure.

Referring to FIG. 3 we provide a glass substrate 10 having a plurality of parallel metal assist structures 20 applied on top of the glass substrate. The metal assists are preferably tungsten, osmium or quad metal. An ITO electrode 22 was deposited on top of each metal assist structure. The TFEL display has a conventional stack of a dielectric layer 14, phosphor layer 16 and second dielectric layer 18. A plurality of metal electrodes 15 are placed on top of dielectric layer 18 and positioned normal to the direction of the ITO electrodes. As can be seen more clearly in FIG. 4, the ITO electrode will have a rounded corners 24. The corners will become more and more rounded as the thickness of the ITO structure is increased. We prefer that the ITO electrodes have beveled edges 26. This is done with conventional sputtering techniques.

Figure 4:
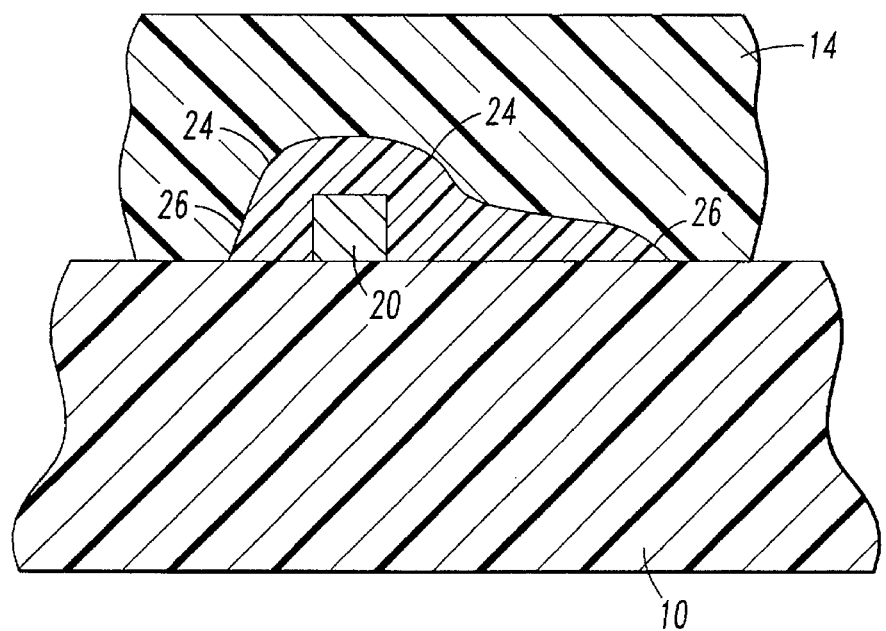
FIG. 4 is a cross-sectional view similar to FIG. 3 showing an enlarged view of one metal assist structure and an overlaying ITO electrode.

In FIG. 3 the metal assist structure is shown to have a width approximately ⅓ the size of the entire width of the ITO electrode. In practice this is unlikely to occur. More likely, the metal assist structure will be as shown in FIG. 4. The metal assist structure would have a width of about 50 µm while the ITO would have width adjacent the glass substrate of 254 µm. The metal assist structure preferably has a height of 0.3 µm and the ITO has approximately the same thickness, 0.3 µm. As shown in FIG. 4, the ITO structure will have a higher height above the glass structure where the metal assist structure is present. Although the thickness of the ITO electrode will remain essentially consistent throughout its width.

In a conventional metal assist structure the resistance of the ITO electrode is represented by the equation $$1/R_r = 1/10 \ (\Omega/\text{square})$$

Figure 1:
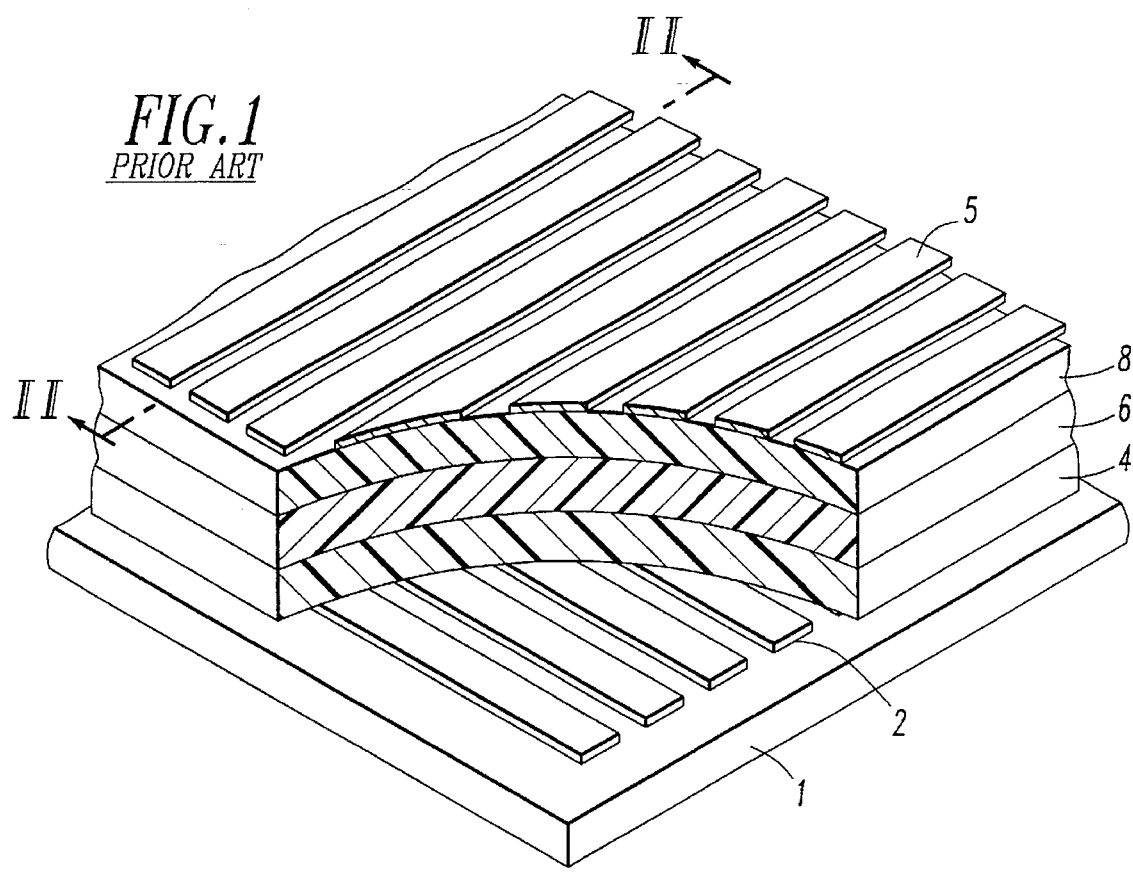
FIG. 1 is a perspective view partially cut away of a prior art TFEL panel.
Figure 2:
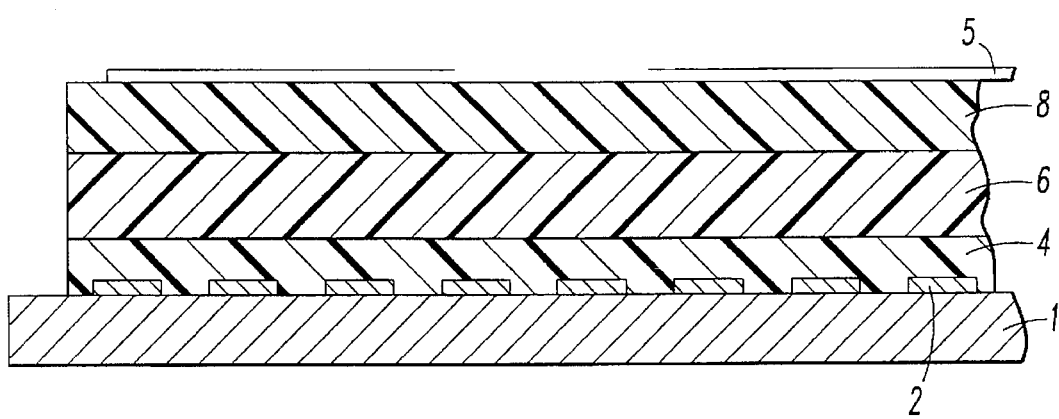
FIG. 2 is a cross sectional view taken along the line II—II in FIG. 1.

In a situation where there is a metal assist structure the conductivity of the electrode can be representative by $$1/R_r = 1/R_1 + 1/R_2$$

where $R_1$ is the resistivity of the ITO material and $R_2$ is the resistivity of the metal assist. For the structure shown in FIGS. 1 and 2, the resistivity of the ITO material conventionally is 10 $\Omega$/square. The resistivity of the metal assist is approximately 0.5 $\Omega$/square. Thus, the conductivity of an improved TFEL panel having a metal structure is dominated by the conductivity of the metal assist. As a consequence, by adding the metal assist structure the conductivity has been greatly improved. Yet, unless the panel is constructed in accordance with the present invention it will have deleterious electric fields at the edges of the metal assist structures.

Since there are no sharp corners at the interface of the metal assist structure and the dielectric layer in the present TFEL panel, the problem of high electric fields in the dielectric layer has been eliminated.

Although we have described certain present preferred embodiments of our improved thin film electroluminescent display panel with metal assist, it should be distinctly understood that this invention is not limited thereto but may be variously embodied within the scope of the following claims.

We claim:

1. An electroluminescent display panel comprising:
 a. a glass substrate;
 b. a plurality of parallel metal assist structures deposited on the glass substrate;
 c. a plurality of parallel transparent electrodes deposited over and aligned with the plurality of parallel metal assist structures such that each parallel metal assist structure is surrounded by a transparent electrode and each transparent electrode has a surface over which a first dielectric layer can be deposited, which surface has no sharp corners;
 d. a first dielectric layer deposited on the surface of each of the plurality of parallel transparent electrodes;
 e. a layer of phosphor material deposited on the first dielectric layer;
 f. a second dielectric layer deposited on the layer of phosphor material; and
 g. a plurality of metal electrodes deposited over the second dielectric layer.

2. The elctroluminescent display panel of claim 1 wherein the parallel metal assist structures are one of tungsten and osmium.

3. The electroluminescent display of claim 1 wherein the parallel metal assist structures are a quad metal.

4. The electroluminescent display of claim 1 wherein a portion of each parallel transparent electrode covers a top surface of an associated metal conductor and that portion of the parallel transparent electrode has a height greater than a height of the associated metal assist structure.

5. The electroluminescent display of claim wherein a combined height of the portion of the parallel transparent electrode and the height of the associated metal assist structure does not exceed 6000 angstroms.

6. A method of making an electroluminescent display comprising the steps of:
 a. providing a glass substrate;
 b. depositing a plurality of parallel metal assist structures on the glass substrate;
 c. depositing a plurality of transparent electrodes over and aligned with the plurality of parallel metal assist structures so that each metal assist structure is surrounded by a transparent electrode and each transparent electrode has a surface over which a first dielectric layer can be deposited, which surface has no sharp corners;
 d. depositing a first dielectric layer on the surface of each of the plurality of transparent electrodes;
 e. depositing a layer of phosphor material on the first dielectric layer;
 f. depositing a second dielectric layer on the layer of phosphor material; and
 g. placing a plurality of metal electrodes over the second dielectric layer.

* * * * *